United States Patent
Schilling

(10) Patent No.: US 6,838,785 B2
(45) Date of Patent: Jan. 4, 2005

(54) OPERATING DEVICE FOR AN ELECTRICAL APPLIANCE

(75) Inventor: Wilfried Schilling, Kraichtal (DE)

(73) Assignee: E.G.O. Elektro-Geraetebau GmbH (DE)

( * ) Notice: Subject to any disclaimer, the term of this patent is extended or adjusted under 35 U.S.C. 154(b) by 0 days.

(21) Appl. No.: 10/391,953

(22) Filed: Mar. 18, 2003

(65) Prior Publication Data
US 2003/0178290 A1 Sep. 25, 2003

(30) Foreign Application Priority Data
Mar. 19, 2002 (DE) .......................... 102 12 954

(51) Int. Cl.⁷ .................. H01F 38/00; H01H 36/00; H05B 3/74
(52) U.S. Cl. .................. 307/104; 219/660; 307/116
(58) Field of Search .................. 200/18; 219/457.1, 219/507, 508, 620, 627, 660–671; 335/205–208; 338/32 R, 32 H; 307/104–116

(56) References Cited
U.S. PATENT DOCUMENTS 4,233,593 A * 11/1980 Bigelow ........................ 341/15
4,812,804 A * 3/1989 Masaki ........................ 338/200
4,983,812 A * 1/1991 Worrall et al. ............ 219/445.1
5,929,131 A * 7/1999 Bowen ........................ 523/116

FOREIGN PATENT DOCUMENTS

| DE | 10212953 A1 | * 10/2003 | ............. F24C/7/08 |
| EP | 0 497 191 A1 | 8/1992 | |
| EP | 0 565 976 A1 | 10/1993 | |
| EP | 0 600 780 A1 | 6/1994 | |
| EP | 0 844 325 A2 | 5/1998 | |
| EP | 0 867 792 A1 | 9/1998 | |

* cited by examiner

Primary Examiner—James R. Scott
(74) Attorney, Agent, or Firm—Akerman Senterfitt

(57) ABSTRACT

In an embodiment of the invention it is possible to create an operating unit (11) with a rotary toggle (14), which has an integrated bearing device (15) with which the operating unit (11) can be magnetically fixed to a cover (12). The operating unit (11) has a control means (23) with a microprocessor for evaluating magnetic signalling means (19), which detect a rotation of the rotary toggle (14) relative to the bearing device (15). Through a first transformer (26) in the operating unit (11) and a second transformer (29) on the underside of the cover (12), it is possible to have both a signal transmission and a power transmission between the operating unit (11) and the electrical appliance.

18 Claims, 1 Drawing Sheet

OPERATING DEVICE FOR AN ELECTRICAL APPLIANCE

FIELD OF APPLICATION AND PRIOR ART

The invention relates to an operating device for an electrical appliance, preferably an electrical heating appliance such as a cooker.

EP 600 780 A1 discloses an operating device for an electric cooker. In this case a rotary device in the form of a rotary toggle is placed in a holder on the surface of an operating unit. In said rotary toggle are provided magnets, which act on reed switches below the surface. In this way it is possible to detect a rotation of the rotary toggle and as a function thereof a switching signal is generated. The disadvantage arises that the association of the signal-generating signalling means with the rotary toggle is not always particularly simple and if the association is faulty problems arise.

PROBLEM AND SOLUTION

The problem of the invention is to provide an operating device of the aforementioned type with which it is possible to avoid the disadvantages of the prior art, particularly with respect to the costs for the entire electrical appliance and with respect to the operating comfort and safety.

This problem is solved by an operating device having the features of claim 1. Advantageous and preferred developments of the invention form the subject matter of further claims and are explained in greater detail hereinafter. By express reference the wording of the claims is made into part of the content of the description.

According to the invention an operating device has an operating unit, which in turn has a rotary device for the rotary operation of the electric cooker. The operating unit can be fixed to a cover or surface of the electrical appliance. Exclusively in the operating unit signalling means are provided, which generate signals as a function of a position and/or position change of the rotary device. These signals can be processed by control means of the operating unit in order to control the electrical appliance in accordance with the operation. The electrical appliance is connected to the signalling means by a contact-free signal transmission. The operating unit finally has a power supply.

As a result of the solution according to the invention it is possible to create a substantially autarchic operating unit, which itself comprises the signalling means. This renders separate signalling means on the electrical appliance unnecessary. Through the provision of the signalling means directly in the operating unit, a correct association is pre-established at all times. The signals transmitted by the operating unit to the control means of the operating device or electrical appliance, can be generated from original position and/or position change signals in such a way that they can be used directly for driving the functional units of the electrical appliance.

The signalling means can operate in different ways. They are preferably constructed for a magnetic operating procedure and have at least one signalling magnet and at least one magnetic field sensor. In particularly preferred manner there are several signalling magnets and/or several magnetic field sensors. This permits a more precise detection of position changes or a rotary operation.

In an alternative embodiment of the invention the signalling means can be constructed in such a way that in different positions they generate different and in particularly differing magnitude electrical signals. This is possible e.g. through a potentiometer or a so-called grey code switch. Whereas in the case of the aforementioned methods with magnetic field sensors essentially pulses are produced corresponding to predetermined angular steps, in this case the magnitude of the electrical signal is modified.

In order to increase the mechanical stability and precision of an operation, the operating unit can have a bearing device for the rotary device. The rotary device is mounted in rotary manner on the bearing device. The bearing device is fixed in substantially immovable manner to the cover and can also be removed again. Fixing more particularly serves to maintain the necessary precision on operating the operating unit, as well as to produce an operating feeling similar to that with a fixed rotary selector switch.

The bearing device can be secured to the cover by a holding power, which can be differently produced by holding means, e.g. magnetically. This makes it possible to carry out fixing without it being visible.

The bearing device can be integrated into the operating unit. The operating unit can also contain the control means. It is also possible to provide the aforementioned power supply on the operating unit. It is advantageous here that the bearing device can be provided in a position-invariable manner with respect to the electrical appliance. It can e.g. serve as a reference point for the rotary operation of the operating unit. It is also advantageous for the power supply to take place at a specific location.

The aforementioned signal or signalling magnet can advantageously be secured to the rotary device, whilst the at least one magnetic field sensor can be positioned, in particular in fixed manner on the remaining operating unit.

With particular preference the magnetic field sensor is placed on the bearing device. This offers the advantage that the control means can also be positioned here, so that the connection of both elements with respect to one another is simple.

The control means can have a signal processing means, particularly for the signals of the magnetic field sensors, where a microcontroller can be provided. It is in this way possible to convert signals of the signalling means into switching signals for operating the electrical appliance. Therefore the operating unit does not merely emit signals, which characterize a rotary operation in any random form. It is instead possible to directly generate signals, which can e.g. be used for driving electronic power switches.

Preferably the operating unit is constructed for operating a part, particularly a single functional unit of the electrical appliance, such as e.g. a radiant heating system corresponding to a hotplate. Therefore an operating unit can be constructed corresponding to a conventional rotary toggle with electrical switch, such as are e.g. conventional with hobs.

The power supply of the operating unit can be provided by its own power source such as e.g. a battery or accumulator. However, there is preferably a power transmission from the electrical appliance to the operating unit. This can in particularly preferred manner take place in contact-free form, e.g. by transformer and through the walls of the electrical appliance and operating unit. For transformer power transmission it is possible to provide coils on both the electrical appliance and in the operating unit, preferably on the bearing device. A transformer power transmission has the major advantage that there is no need for electric leads or contacts, which can easily become dirty during the operation of an electrical appliance, which increases operating safety and comfort.

It is also possible to construct the power transmission for signal transmission, particularly from the operating unit or control means of the latter to the remaining operating device. This can take place by clocking corresponding to the information. It is in particular possible by clocking or a signal or power transmission displaced in time slot form for both operating modes to be effected by the same device.

According to a further development of the invention signal transmission can take place bi-directionally. This makes it possible e.g. not only to forward control signals from the control means of the operating unit to the operating device and therefore to the electrical appliance. There can also be a back indication to the operating unit, e.g. in order to close a control loop. According to the invention it is also possible to provide on the operating unit electrical display means, which are connected to the power supply and the control means. They can be constructed for displaying signals or symbols. It is particularly advantageous to have a signal transmission from the electrical appliance, via the operating device to the display means of the operating unit. Thus, a display of the operating unit can display the actual state of the electrical appliance.

The display means are preferably located on the bearing device, which permits a simple, direct fastening and in particular a direct connection to the control means and/or power supply on the bearing device. It is also possible to fix them in position on the bearing device, even during the rotary operation of the rotary device. It is e.g. possible to place the display means centrally over the fulcrum pin of the rotary device. In this case the fulcrum pin projects substantially perpendicularly from the area where the operating unit is placed on the electrical appliance. It is also advantageous to have a display on a top surface of the operating unit.

For display purposes it is possible to have lighting means, e.g. LEDs, which are characterized by a low power consumption. In particularly preferred manner there are two mutually, parallel-connected LEDs connected to the power supply in the operating unit. This offers the advantage that it is e.g. possible to generate an a.c. voltage through a transformer power transmission and which can be fully utilized with LEDs connected in opposition.

In a further development of the invention, the operating unit is constructed for operating other functional units of the same electrical appliance or possibly other electrical appliances, even of different types. This e.g. makes it possible to use an operating unit both for a hob and for an oven or washing machine. Such an operating unit can be fitted to the given electrical appliance and e.g. automatically and in known manner receive the communication with the electrical appliance in order to take over its control or influencing.

These and further features can be gathered from the claims, description and drawings and the individual features, both singly and in the form of sub-combinations, can be implemented in an embodiment of the invention and in other fields and can represent advantageous, independently protectable constructions for which protection is claimed here. The subdivision of the application by subheadings and individual sections in no way limits the general validity of the statements made there under.

BRIEF DESCRIPTION OF THE DRAWINGS

An embodiment of the invention is described in greater detail hereinafter relative to the attached drawings, wherein show.

DETAILED DESCRIPTION OF THE EMBODIMENT

Figure 1:
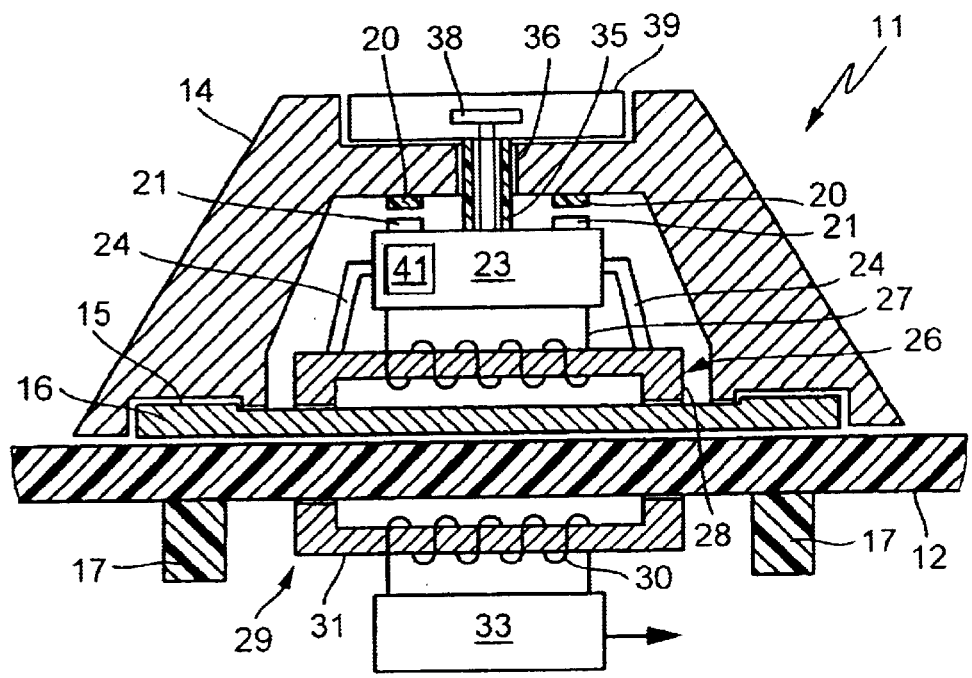
FIG. 1 A diagrammatic section through an operating unit according to the invention.
Figure 2:
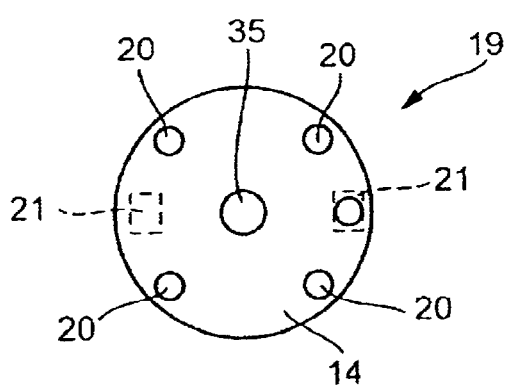
FIG. 2 A diagrammatic representation of signalling means formed by five distributed signalling magnets and two Hall sensors.
Figure 3:
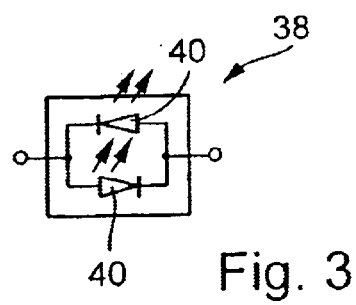
FIG. 3 A very simple construction of an illuminated display formed by two LEDs.

FIG. 1 shows in section an operating unit 11, as can be obtained in an embodiment of the invention. It must be borne in mind that FIGS. 1, 2 and 3 are all to be understood in a diagrammatic manner in order to represent in detail the functionality of an operating unit according to the invention.

The operating unit 11 is placed on a glass ceramic section 12, which forms part of a glass ceramic hob. However, it would also be possible to have a random cover, also made from plastic or as a shield for an electrical appliance.

The operating unit 11 comprises a rotary toggle 14 and is constructed for the rotary operation of the electrical appliance or a not shown functional unit located on said electrical appliance. Such a functional unit can e.g. be a hotplate of a hob. The rotary toggle 14 tapers conically upwards, but this is not absolutely necessary. All that is important is that the rotary toggle forms a type of housing for the functional units or parts housed therein and which will be explained hereinafter.

The rotary toggle 14 is mounted on a bearing device 15, the bearing being a pivot or rotary bearing. The bearing device 15 can be secured in a substantially fixed position on the glass ceramic section 12. As shown, said fastening is advantageously releasable. It is possible to construct the outer ends 16 of the bearing device 15 in magnetic or magnetically acting manner. Corresponding holding magnets 17, which are positioned below the glass ceramic section 12, secure the mounted bearing device 15 or operating unit 11. This type of fixing must be sufficiently firm that during a normal rotary operation of the rotary toggle 14 or the operating unit 11 there is no position change. However, it must also be possible to release the operating unit 11 without excessive effort from the glass ceramic section 12, e.g. for cleaning purposes, for safety or for use at another location.

The operating unit 11 has signalling means 19 by means of which it is possible to detect the position or position change between a fixed-position bearing device 15 and rotary toggle 14 mounted in rotary manner thereon. For this purpose the signalling means 19 have signal or signalling magnets 20, which are placed on the upper inside of the rotary toggle 14. On the bearing device 15 or on a control means 23 connected in fixed position manner with the latter, are provided corresponding Hall sensors 21. The arrangement can be gathered in detail from the plan view of FIG. 2. In exemplified manner there are five uniformly distributed signalling magnets 20 and two Hall sensors 21. On rotating the rotary toggle 14 relative to the bearing device 15, the individual signalling magnets 20 migrate over the Hall sensors 21 and generate on the latter in alternating manner signals, from which a rotation can be characterized. To increase the precision of detecting a rotation, even more signalling magnets or Hall sensors can be provided.

As indicated hereinbefore, a control means 23 in a corresponding housing is firmly placed on the bearing device 15 by means of supports 24. The control means advantageously has a microcontroller 41, which evaluates the signals from the signalling means 19 or Hall sensors 21. During said evaluation the control means 23 advantageously not only forwards the pure position signals of the Hall sensors 21, but instead determines therefrom signals such as can e.g. be directly used for driving power switches, no matter whether there are electronic or electromechanical relays. Thus, part and in particular the whole intelligence of a control means can be combined within the operating unit control means 23.

By means of the supports 24 the control means 23 is fixed to a first transformer 26, namely to the upper yoke 28 of the bearing device 15. Obviously it is also possible to have a direct fixing to the bearing device 15 and no limits are set here.

The first transformer 26 comprises an upper coil 27 connected to the control means 23 and guided around the upper yoke 28. A corresponding second transformer 29 is positioned below the glass ceramic section 12 and comprises a lower coil 30 and a lower yoke 31. The second transformer 29, in similar manner to the holding magnets 15, is fixed in position to the underside of the glass ceramic section 12. This can e.g. take place by adhesion or a stable retention below the glass ceramic section 12.

A lower control means 33 is connected to the lower coil 30 but, supplementing what was stated hereinbefore, it can incorporate e.g. only part, but more particularly no intelligence of the overall control means. The essential function of the lower control means 33 is to ensure signal transmission between the first transformer 26 and second transformer 29 to the control means 23. Thus, in the simplest case, signal lines are merely passed through the lower control means 33 e.g. to power switches of the electrical appliance.

However, according to a further development of the invention and as indicated hereinbefore, it is also possible to guide the signal transmission not only from the control means 23 to the power switches. It is also possible to provide back indications or a signal transmission from the electrical appliance to the control means 23. It is e.g. possible to form a closed control loop, which is monitored and influenced by the control means 23. In conjunction with the upper control means 23, it is possible for this purpose to build up in the lower control means 33 a time slot-controlled transmission in one direction in each case.

For mounting the rotary toggle 14 on the bearing device 15 the ends 16 of the bearing device are provided in the manner shown in FIG. 1. They engage in corresponding recesses of the rotary toggle 15 and ensure a certain radial guidance. In addition, on the top of the housing of control means 23 is provided a fulcrum pin 35, which is consequently fixed. By means of a pivot bearing 36 the rotary toggle 14 is mounted on the fulcrum pin 35. A cover 39 is inserted in a corresponding cut-out of the top of the rotary toggle 14.

The cover 39 can serve to prevent an axial removal of the rotary toggle 14 from the bearing device. This would e.g. also be made possible by upwardly wider ends 16 of the bearing device 15 engaging in overlapping and clamping recesses in the underside of the rotary toggle 14. A fixing of the cover 39 to the fulcrum pin 35 can e.g. take place by slipping on or, alternatively, by screwing down or bonding.

The cover 39 also has an electro-luminescent display 38, which is connected by connecting lines to the control means 23. The electro-luminescent display 38 can have numerous different configurations. It may solely emit light signals. In a further development of the invention it can be constructed as a symbol display or even as a seven segment display. It can also be fixed to the fulcrum pin 35 or, if the cover 39 is fixed, can also be secured to the latter.

In a further development of the invention, an electro-luminescent display can be provided on the top of the control means 23 and emits upwards through the channel in the fulcrum pin 35. The cover 39 could also be fixed to the rotary toggle 15 and therefore rotatable.

A particularly simple variant of an electro-luminescent display 38 is shown in FIG. 3. It comprises two LEDs 40 connected in opposition and as a result it is possible to supply them with alternating current and obtain an optimum power or light yield. Obviously all possible conventional electro-luminescent displays can be used for the operating elements or the like.

A power supply is required for supplying the electro-luminescent display 38 and the control means 23. It can be provided in the control means 23 or operating unit 11 in the form of a battery or accumulator. However, according to a particularly preferred embodiment of the invention, the power transfer takes place via transformers 26 and 29. A small rectifier circuit can e.g. be provided in the control means 23 in order to ensure a supply of the control means in the necessary manner.

Advantageously signal transmission and power transmission take place in separate time slots, e.g. in clocked manner. It is also possible to provide in the control means 23 a power supply device in the form of a capacitor with a corresponding capacitance or an accumulator. This can take place in time periods where no instantaneous signal transmission occurs or the electrical appliance is in a standby mode.

A subdivision of signal transmission and power transmission into time sections can either be taken over by the upper control means 23 or the lower control means 33. Such a split transmission is known per se and can be implemented by the expert without major problems.

Thus, according to the represented embodiment of the invention a control unit 11 can be created, which on the one hand has a rotary toggle 14 for the rotary operation of an electrical appliance. It is possible to fix the operating unit 11 to a cover, e.g. the glass ceramic section 12 of an electrical appliance, in this case a hob. Mounting takes place in fixed manner by means of the magnetically retained bearing device 15.

The advantage of such a bearing device is that it can be removed from the cover and there are no visible or mechanical holding means. However, the rotary toggle, like conventional rotary toggles with the fulcrum pin 35 and pivot bearing 36 can be mounted very precisely, which is a major advantage when generating position signals.

The entire intelligence of a control means for the associated functional unit is present in the operating unit 11. As signal transmission and power transmission take place in transformer manner or via transformers 26 and 29, there is no need for open electrical terminals, U-links, connectors or cables.

On the rotary toggle 14 the operating unit 11 can be equipped with display means, e.g. simple electro-luminescent means or a seven segment display. Thus, the operating unit 11 can display information or back indications.

The major advantage of providing the signalling means 19 solely on the operating unit 11 is that they can be constructed in such a way that a detection of position changes is possible in a very precise manner and the construction can be kept relatively simple.

What is claimed is:

1. An operating device for an electrical appliance, wherein:

the operating device has an operating unit forming a part of the operating device, said operating unit has a rotary device for the rotary operation of the electrical appliance with position change, the electrical appliance has a cover and said operating unit can be fixed to the cover, signalling means are provided for generating signals as a function of a position change or a position of said rotary device, said operating unit has control means for processing signals for the purpose of influencing the electrical appliance, said signalling means are exclusively contained in said operating unit, said control means are connected to said signalling means, said operating unit has a power supply for supplying power to said operating unit and said control means, said operating device has a signal transmission from said signalling means to said electrical appliance, said signal transmission takes place in contact-free manner, said operating unit has a bearing device for said rotary device, said rotary device is mounted in rotatable manner on said bearing device, and said bearing device is fixable in substantially immovable manner to the cover and is also removable.

2. The operating device according to claim 1, wherein said signalling means have at least one signalling magnet and at least one magnetic field sensor.

3. The operating device according to claim 1, wherein said signalling means generate different electrical signals in different positions of said rotary device.

4. The operating device according to claim 3, wherein said signalling means comprise a potentiometer for modifying the magnitude of said electrical signals.

5. The operating device according to claim 1, wherein said bearing device is fixable to the cover by a magnetic holding power, which is produced by magnetic holding means located at said cover and at said bearing device.

6. The operating device according to claim 1, wherein said control means are located on said bearing device.

7. The operating device according to claim 1, wherein said power supply is located on said bearing device.

8. The operating device according to claim 2, wherein at least one signalling magnet is located on said rotary device and said at least one magnetic field sensor is located on said bearing device.

9. The operating device according to claim 1, wherein said control means have a signal processing means in order to convert signals of said signalling means into switching signals for operating the electrical appliance.

10. The operating device according to claim 1, wherein said power supply comprises a power transmission from the electrical appliance to said operating unit.

11. The operating device according to claim 10, wherein said power transmission takes place in contact-free manner through said cover in a transformer manner.

12. The operating device according to claim 10, wherein said power transmission is constructed for signal transmission from said operating unit to said operating device or to the electrical appliance.

13. The operating device according to claim 12, wherein said power transmission is constructed for clocking or time-displaced transmission of power or signals.

14. The operating device according to claim 13, wherein said signal transmission is bi-directional.

15. The operating device according to claim 1, wherein said operating unit comprises electrical display means connected to said power supply and to said control means.

16. The operating device according to claim 15, wherein said display means are placed on said bearing device and are fixed in position during rotary operation of said rotary device.

17. An operating device for an electrical appliance,
wherein the operating device has an operating unit that forms a part of the operating device, said operating unit comprising:
a rotary device for the rotary operation of the electrical appliance with position change;
control means for processing signals for the purpose of influencing the electrical appliance;
signalling means for generating signals as a function of a position change or a position of said rotary device, wherein said signalling means are exclusively contained in said operating unit and wherein said control means are connected to said signalling means; and
a power supply for supplying power to said operating unit and said control means,
wherein the electrical appliance has a cover and said operating unit can be fixed to the cover, and
wherein said operating device has a signal transmission from said signalling means to the electrical appliance, said signal transmission taking place in a contact-free manner.

18. The operating device according to claim 17, wherein said operating unit has a bearing device for said rotary device, said rotary device being mounted in rotatable manner on said bearing device, and said bearing device being removably fixable in substantially immovable manner to said cover.

* * * * *